United States Patent
Sekimoto et al.

(10) Patent No.: US 7,023,732 B2
(45) Date of Patent: Apr. 4, 2006

(54) DATA ERASING METHOD, AND MEMORY APPARATUS HAVING DATA ERASING CIRCUIT USING SUCH METHOD

(75) Inventors: Shunji Sekimoto, Nagasaki (JP); Tomohiro Namise, Nagasaki (JP)

(73) Assignee: Sony Corporation, (JP)

(*) Notice: Subject to any disclaimer, the term of this patent is extended or adjusted under 35 U.S.C. 154(b) by 9 days.

(21) Appl. No.: 10/877,980

(22) Filed: Jun. 29, 2004

(65) Prior Publication Data

US 2005/0012139 A1 Jan. 20, 2005

(30) Foreign Application Priority Data

Jul. 14, 2003 (JP) ............... P2003-274113

(51) Int. Cl.
*H01L 29/788* (2006.01)

(52) U.S. Cl. ............ 365/185.14; 365/185.25; 365/185.26; 365/185.27; 365/185.29; 257/316

(58) Field of Classification Search ............ None
See application file for complete search history.

(56) References Cited

U.S. PATENT DOCUMENTS 6,307,807 B1 * 10/2001 Sakui et al. .......... 365/238.5
2001/0054737 A1 * 12/2001 Nakamura et al. ...... 257/315

FOREIGN PATENT DOCUMENTS

JP 2000-294658 10/2000

* cited by examiner

*Primary Examiner*—Ngan V. Ngô
(74) *Attorney, Agent, or Firm*—Rader, Fishman & Grauer PLLC; Ronald P. Kananen

(57) ABSTRACT

The present invention is to propose an data erasing method, a memory apparatus, and a data erasing circuit which are able to reduce the time required to boost the potential of the semiconductor substrate thereby to reduce the time required to erase data. Namely, a memory apparatus having a data erasing circuit that erases stored data by applying an erasing voltage between a semiconductor substrate and a control gate so as to discharge electric charges accumulated in a floating gate is disclosed. In this case, the data erasing circuit boosts a potential of the semiconductor substrate side while placing the control gate into its floating state; and applies an erasing voltage between the semiconductor substrate and the control gate to make the potential of the control gate to a predetermined potential.

4 Claims, 4 Drawing Sheets

DATA ERASING METHOD, AND MEMORY APPARATUS HAVING DATA ERASING CIRCUIT USING SUCH METHOD

CROSS REFERENCE TO RELATED APPLICATION

This application claims priority from Japanese Priority Document No. 2003-274113, filed on Jul. 14, 2003 with the Japanese Patent Office, which document is hereby incorporated by reference.

BACKGROUND OF THE INVENTION

1. Field of the Invention

The present invention relates to a data erasing method and a memory apparatus having a data erasing circuit using such method.

2. Description of the Related Art

Conventionally, a variety of electronic equipment, including computers, houses a memory apparatus that can store and erase data.

This memory apparatus is usually composed of a storage element for storing the data and a data erasing circuit for erasing the data.

As this type of such storage element, there has been used a nonvolatile semiconductor memory cell which is structured to have a control gate and a floating gate on a semiconductor substrate. This storage element stores data based on presence or absence of electrons to be accumulated in the floating gate.

In the case of erasing the data in this storage element, the data is erased by discharging the electrons accumulated in the floating gate through the semiconductor substrate side.

When discharging the electrons accumulated in the floating gate through the semiconductor substrate side, at first, the control gate is placed into its grounded condition, and thereafter, a potential of the semiconductor substrate is boosted by a boost voltage generating circuit housed in the data erasing circuit in order to boost up a potential of the semiconductor substrate up to a predetermined potential.

Thereby, a predetermined erasing voltage is applied between the control gate and the semiconductor substrate, and this erasing voltage is used to discharge the electrons accumulated in the floating gate through the semiconductor substrate side in order to erase data (see, for example, a Patent Document 1: Japanese Patent Laid-Open No. 2000-294658).

In the above-mentioned conventional data erasing method, however, for the reason that the control gate is placed into its grounded condition when boosting the potential of the semiconductor substrate side, the control gate and the semiconductor substrate may cause a capacity coupling, and a part of the electric charges for boosting the potential of the semiconductor substrate leaks into the control gate side.

Hence, it takes long time to boost the potential of the semiconductor substrate, and there has been the problem of increasing the time required to erase data.

There has also been the problem of increasing power consumption during data erasing, because of the above-mentioned leakage of the electric charges.

SUMMARY OF THE INVENTION

Therefore, in a first aspect of the present invention, a data erasing method for erasing stored data by applying an erasing voltage between a semiconductor substrate and a control gate so as to discharge electric charges accumulated in a floating gate is proposed, wherein it is arranged to apply an erasing voltage between the semiconductor substrate and the control gate by boosting a potential of the semiconductor substrate side while placing the control gate into its floating state, and then making the potential of the control gate to a predetermined potential.

In the present invention according to a second aspect, the potential of the control gate is made to a predetermined potential by lowering it in a predetermined period of time such that the boosted potential of the semiconductor substrate side does not decrease.

In a third aspect of the present invention, a memory apparatus having a data erasing circuit that erases stored data by applying an erasing voltage between a semiconductor substrate and a control gate so as to discharge electric charges accumulated in a floating gate is proposed, wherein the data erasing circuit is arranged to apply an erasing voltage between the semiconductor substrate and the control gate by boosting a potential of the semiconductor substrate side while placing the control gate into its floating state, and then making the potential of the control gate to a predetermined potential.

In a fourth aspect of the present invention, a data erasing circuit is adapted to bring a potential of a control gate to a predetermined potential by lowering it in a predetermined period of time such that the boosted potential of the semiconductor substrate side does not decrease.

In accordance with the present invention, in the data erasing method for erasing stored data by applying erasing voltage between a semiconductor substrate and a control gate so as to discharge electric charges accumulated in a floating gate, it is arranged to apply an erasing voltage between the semiconductor substrate and the control gate by boosting a potential of the semiconductor substrate side while placing the control gate into its floating state, and then making the potential of the control gate to a predetermined potential. It is, therefore, able to reduce the time required to boost the potential of the semiconductor substrate thereby to reduce the time required to erase data.

Further, it is able to prevent the leakage of electric charges during the boost of the potential of semiconductor substrate, thereby enabling to prevent an increase in power consumption required to erase data.

Further, in accordance with the present invention, the potential of the control gate is made to a predetermined potential by lowering it in a predetermined period of time such that the boosted potential of the semiconductor substrate side does not decrease. It is, therefore, able to prevent a decrease in the potential of the semiconductor substrate along with the decrease in the potential of the control gate, thereby enabling to prevent an increase in power consumption required to boost the potential of the semiconductor substrate.

Still further, in accordance with the present invention, in the memory apparatus having a data erasing circuit that erases stored data by applying an erasing voltage between a semiconductor substrate and a control gate so as to discharge electric charges accumulated in a floating gate, the data erasing circuit is arranged to apply the erasing voltage between the semiconductor substrate and the control gate by boosting the potential of the semiconductor substrate side while placing the control gate into its floating state, and then making the potential of the control gate to a predetermined potential. It is, therefore, able to reduce the time required to boost the potential of the semiconductor substrate, thereby enabling to reduce the time required to erase data.

Further, it is able to prevent the leakage of electric charges during the boost of the potential of the semiconductor substrate, thereby enabling to prevent an increase in power consumption required to erase data.

Still further, in accordance with the present invention, the data erasing circuit is adapted to bring the potential of a control gate to a predetermined potential by lowering it in a predetermined period of time such that the boosted potential of the semiconductor substrate side does not decrease. It is, therefore, able to prevent a decrease in the potential of the semiconductor substrate along with the decrease in the potential of the control gate, thereby enabling to prevent an increase in power consumption required to boost the potential of the semiconductor substrate.

DESCRIPTION OF THE PREFERRED EMBODIMENT

Figure 1:
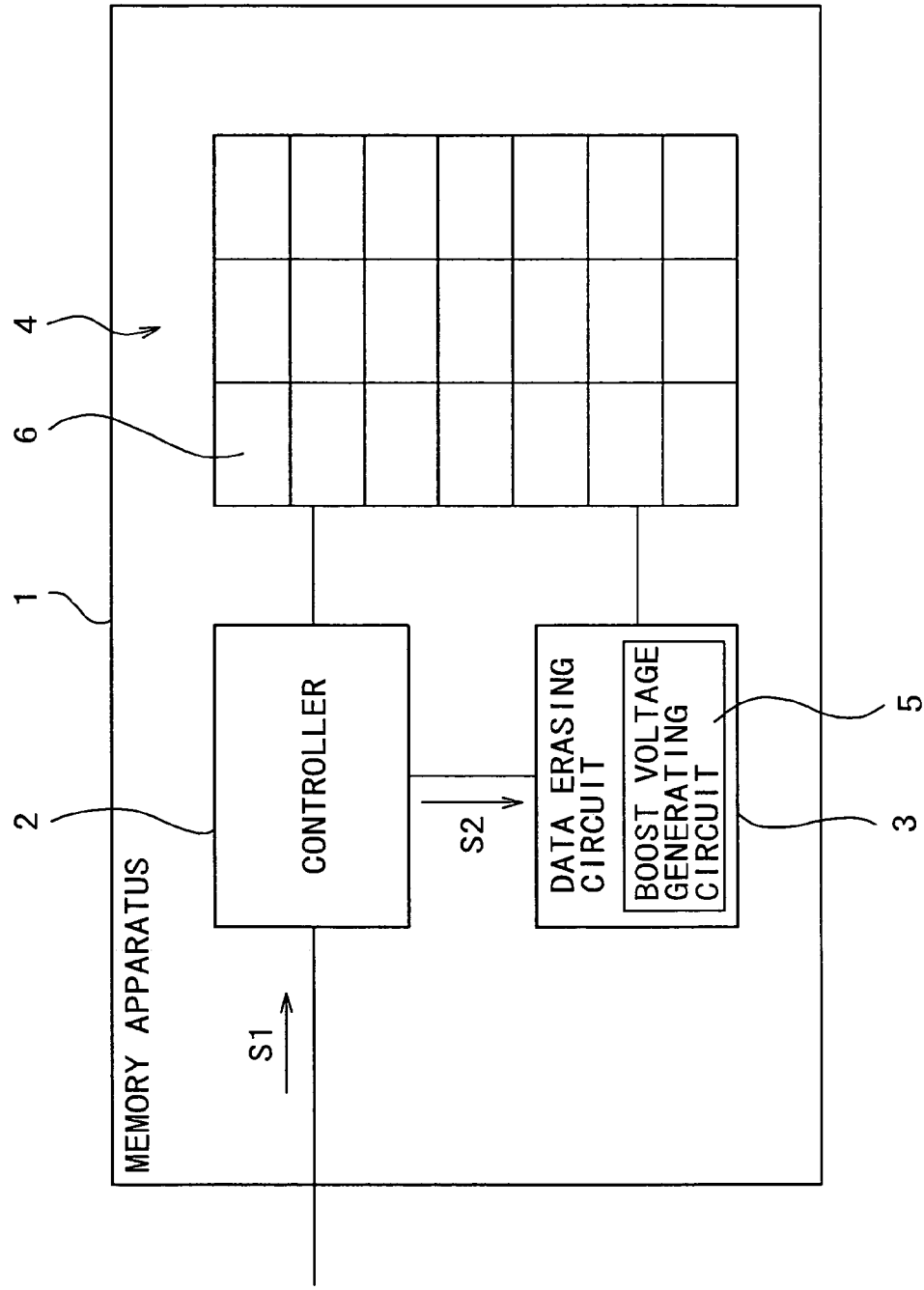
FIG. 1 is an explanatory drawing showing a memory apparatus according to the present invention.

A memory apparatus according to the present invention comprises a storage area composed of a controller, a plurality of storage elements, and a boost voltage generating circuit.

This storage element has a control gate disposed above a semiconductor substrate, and a floating gate for accumulating electric charges between the semiconductor substrate and the control gate, and is constructed such that data storage can be effected based on presence or absence of electric charges accumulated in the floating gate.

Further, the storage element is constructed such that a switch is connected to the control gate, and this switch has a predetermined time constant when changing from a disconnected state to a connected state.

In the case where data erasing operation is effected in the memory apparatus of the foregoing structure, the electric charges accumulated in the floating gate are discharged to erase the stored data by applying an erasing voltage between the semiconductor substrate and the control gate.

Especially in the present invention, first, while placing the switch into its disconnected state by setting the control gate into its floating state, the potential of the semiconductor substrate side is boosted by the boost voltage generating circuit, and the switch is then connected to bring the potential of the control gate to a predetermined potential. Thereafter, the erasing voltage is applied between the semiconductor substrate and the control gate.

This prevents the semiconductor substrate and the control gate from causing a so-called capacity coupling when boosting the potential of the semiconductor substrate, thereby enabling to prevent that a part of the electric charges for raising the semiconductor substrate leaks into the control gate side. It is, therefore, able to reduce the time required to boost the potential of the semiconductor substrate, and thereby to reduce the time required to erase data.

Further, it is able to prevent the leakage of the electric charges during the boost of the semiconductor substrate, thereby enabling to prevent an increase in power consumption required to erase data.

In addition, in the case of connecting a switch having a predetermined time constant to the control gate, when changing from a disconnected state to a connected state and when the potential of the control gate is lowered to a predetermined potential in order to apply erasing potential, the potential of the control gate can be lowered gradually in a predetermined period of time.

Therefore, it is able to prevent the repeated decreases of the potential at the semiconductor substrate side, which is once boosted, as the potential of the control gate decreases, thereby enabling to prevent an increase in the power consumption required to boost the semiconductor substrate at the time of erasing data.

Thus, in the present invention, the potential of the control gate is lowered gradually in a predetermined period of time in order to avoid a decrease in the potential of the semiconductor substrate side, which is boosted once. This is achieved by connecting to the control gate the switch having a time constant that is longer than the period of time to cause no decrease in the potential of the semiconductor substrate side, which is boosted once.

Specific preferred embodiments of the present invention will be described below by referring to the drawings. In the following, a three-transistor type NAND nonvolatile semiconductor memory apparatus will be described as an example. However, the present invention is also applicable to storage elements other than this.

A memory apparatus 1 according to the present invention comprises a controller 2, a storage area 4 and a data erasing circuit 3 as shown in FIG. 1. The data erasing circuit 3 is provided with a boost voltage generating circuit 5.

The data erasing circuit 3 and the storage area 4 are connected to the controller 2.

The storage area 4 is provided with a plurality of storage elements 6 to enable storage of required data.

Figure 2:
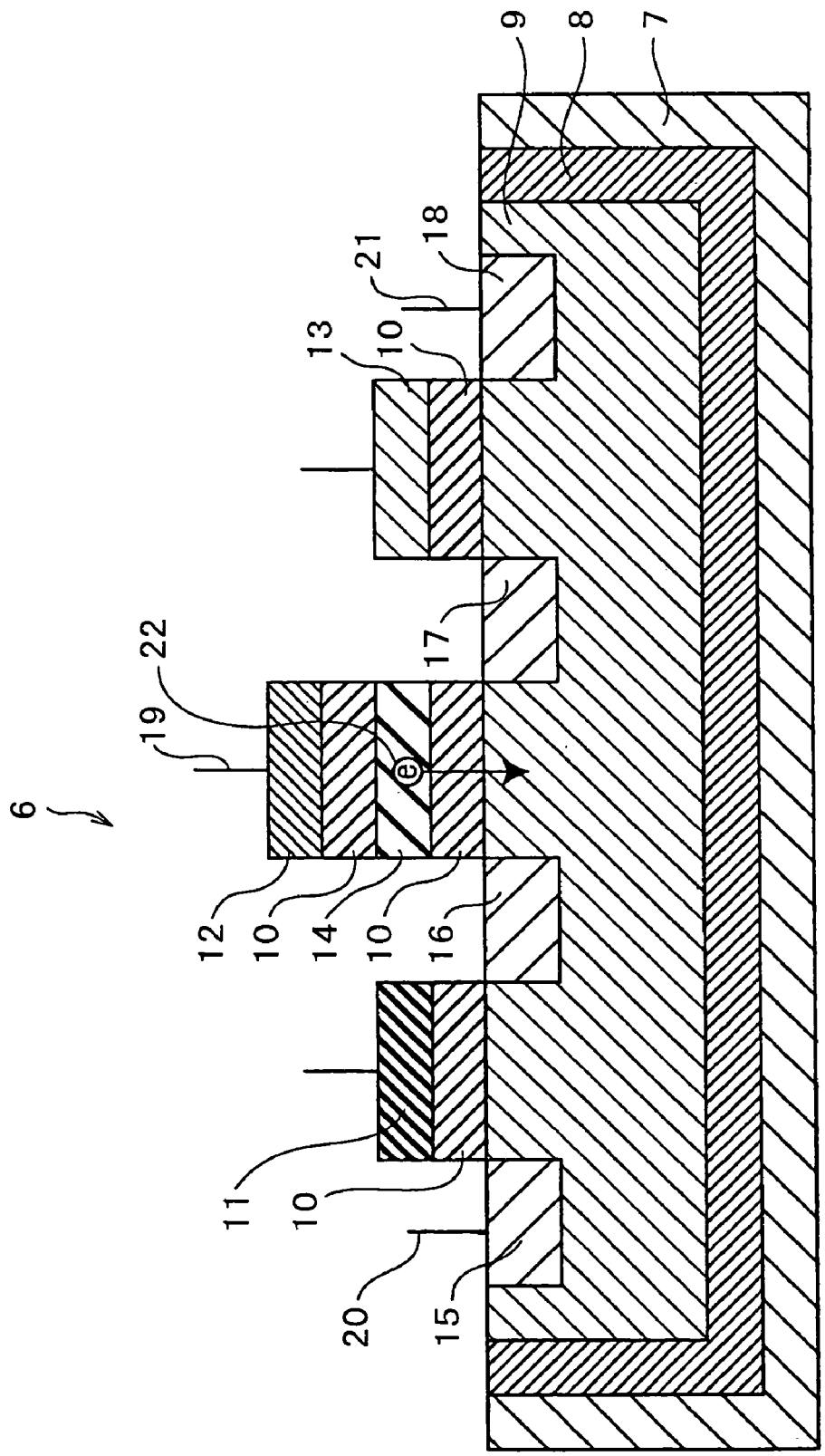
FIG. 2 is an explanatory drawing showing a storage element according to the present invention.

In the storage element 6 as shown in FIG. 2, a N type well 8 doped with a N type impurity is formed inside of a semiconductor substrate 7, and a P type well 9 doped with a P type impurity is formed inside of the N type well 8. A source selecting gate 11, a control gate 12, and a drain selecting gate 13 are provided at spaced intervals with each other, via an oxide film 10 on the upper surface of the P type well 9.

Also in the storage element 6, a floating gate 14 for accumulating electrons in response to data stored is disposed between the control gate 12 and the P type well 9.

Further in the storage element 6, first to fourth N type diffusion layers 15 to 18 formed by implanting a N type impurity into the inside of the P type well 9, are disposed between the source selecting gate 11 and the control gate 12, between the control gate and the drain selecting gate 13, on the left side of the source selecting gate 11, and on the right side of the drain selecting gate 13, respectively. In FIG. 2, a reference numeral 20 indicates a source line connected to the first N type diffusion layer 15, and a reference numeral 21 indicates a bit line connected to the fourth N type diffusion layer 18.

Furthermore in the storage element 6, a word line 19 is connected to the control gate 12. In the word line 19, a switch (not shown) which enables switching between a condition of applying a predetermined voltage to the control gate 12, and an opened condition of not applying the predetermined voltage is disposed. This switch is constructed to have a predetermined time constant when switching from a connected state to a disconnected state, and the potential of the word line 19 changes gradually by the function of this time constant when the switch is allowed to conduct.

The data erasing circuit 3 is arranged to erase the data stored in the storage area 4 on the basis of the control of the controller 2.

In other words, in the controller 2, an erasing signal S1 inputted from external is decoded to create an erasing signal S2 containing the address of the storage element 6, the data stored in which is erased, and thus generated erasing signal S2 is outputted to the data erasing circuit 3.

Figure 3:
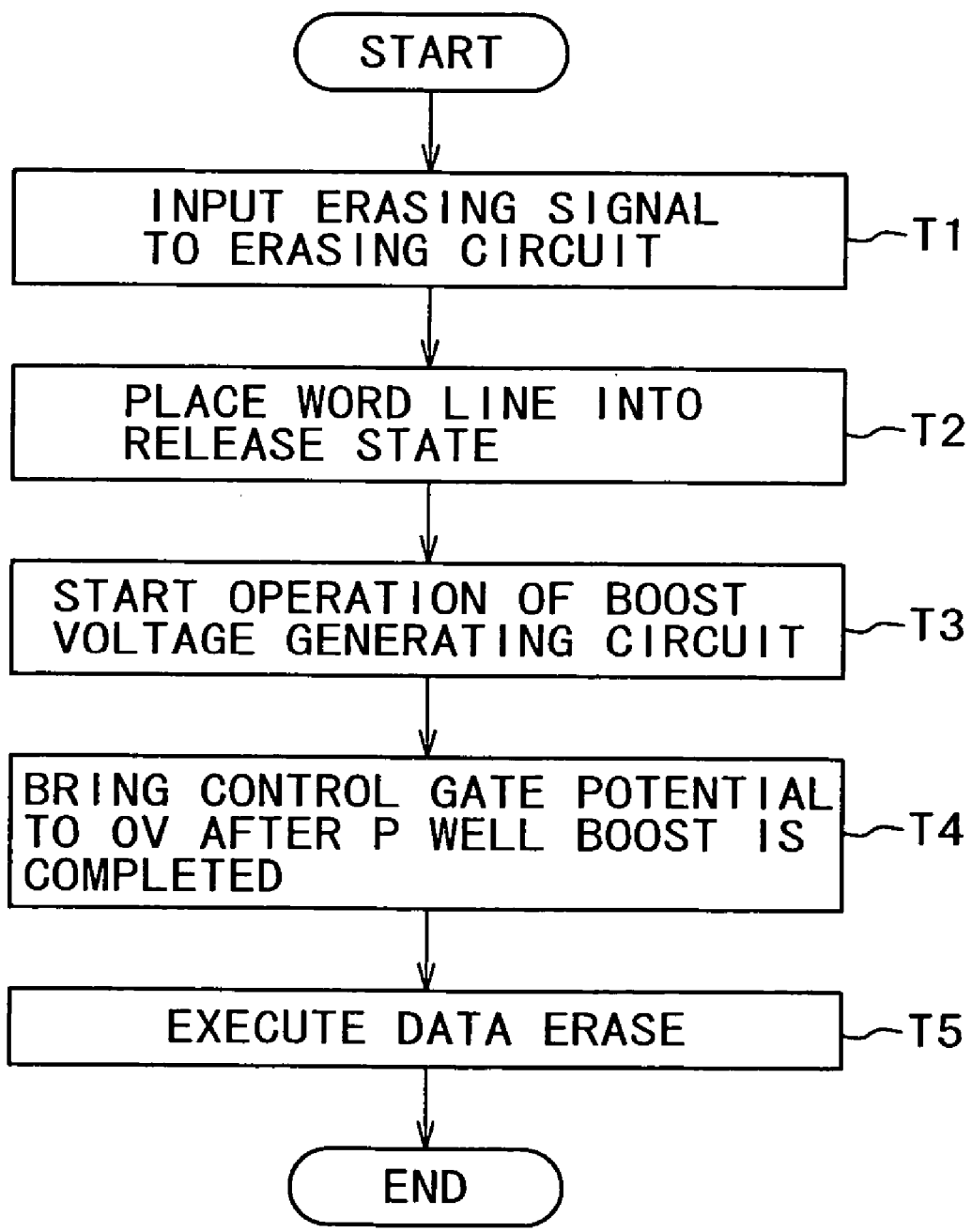
FIG. 3 is a flow chart for erasing operation.

Then, when the erasing signal S2 is inputted from the controller 2, the data erasing circuit 3 erases the data in accordance with the flowchart for erasing operation shown in FIG. 3.

First, the controller 2 inputs the erasing signal S2 to the erasing circuit 3 (Step T1).

The data erasing circuit 3 places the switch provided in the word line 19 into its disconnected state based on the erasing signal S2, and the word line into its released state (Step T2).

Thus, the control gate 12 is placed into its floating state isolated from other portions by placing the word line 19 into its released state.

On this occasion, the data erasing circuit 3 is constructed also to place the source selecting gate 11 and the drain selecting gate 13 into their floating states when placing the control gate 12 into its floating state.

Subsequently, with the control gate 12 placed in its floating state, the boost voltage generating circuit 5 is operated to boost a potential of the P type well 9 that is a part of the semiconductor substrate 7 in order to boost the potential of the P type well 9 up to the potential of a predetermined boost voltage (Step T3).

Since the control gate 12 is in its floating state at this time, the boost of the potential of the P type well is able to be performed in a short period of time.

That is, in the conventional data erasing method, the boost of the potential of the P type well 9 is performed while the control gate 12 is grounded. Therefore, the control gate 12 and the P type well may cause a capacity coupling, and a part of the electric charges for boosting the potential of the P type well 9 leaks into the control gate 12 side.

Figure 4:
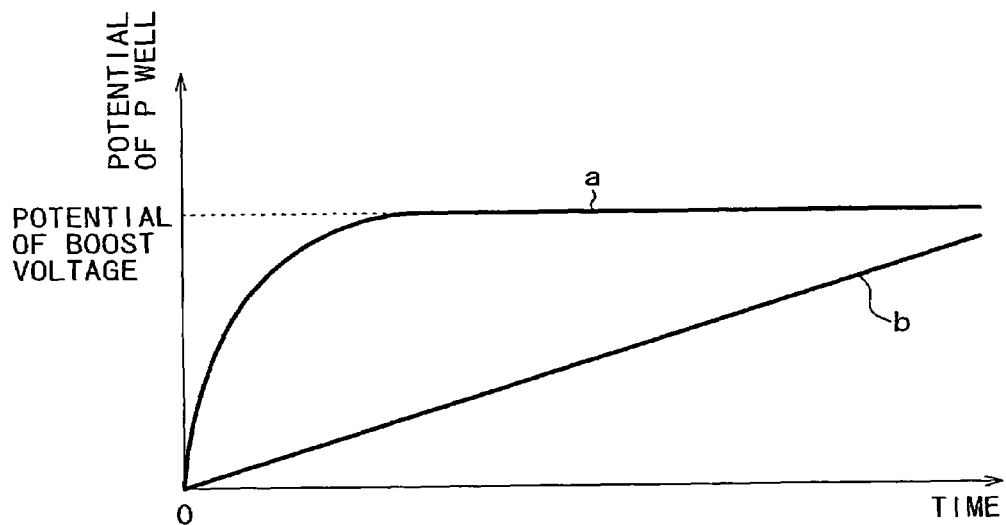
FIG. 4 is an explanatory drawing showing potential increase of a P type well.

Therefore, the potential of the P type well 9 is only gradually boosted as shown by the reference character b in FIG. 4, and it takes long to bring the potential of the P type well 9 up to a predetermined potential.

Whereas, in this preferred embodiment, since the boosting the potential of the P type well 9 is performed while the control gate 12 is placed in its floating state, the control gate 12 and the P type well 9 cause no capacity coupling. It is, therefore, avoidable that a part of the electric charges for boosting the potential of the P type well 9 leaks into the control gate 12, the source selecting gate 11 and the drain selecting gate 13.

This allows for a sharp increase in the potential of the P type well 9 as indicated by the reference character a in FIG. 4. Therefore, the potential of the P type well 9 can be boosted up to the predetermined potential in a shorter period of time than may be the case in the conventional data erasing method, thereby enabling to reduce the time required to erase data.

In addition, the ability to prevent the leakage of the electric charges as discussed above permits to reduce the power consumption required to erase the data, thereby it is able to attain power saving.

In this preferred embodiment, it is constructed such that when boosting the potential of the P type well 9, the erasing circuit 3 not only places the control gate 12 into its floating state, but also places the source selecting gate 11 and the drain selecting gate 13 into their floating states.

It is, therefore, avoidable that when boosting the potential of the P type well 9, the source selecting gate 11 and the drain selecting gate 13 cause capacity coupling, thereby enabling to prevent a part of the electric charges for boosting the potential of the P type well 9 from leaking into the source selecting gate 11 and the drain selecting gate 13.

Thus, the ability to prevent the leakage of the electric charges when boosting potential of the P type well 9 permits to boost the potential of the P type well 9 up to the predetermined potential in a short period of time, thereby enabling to reduce the power consumption required to erase data.

Subsequently, at the point where the potential of the P type well 9 reaches the predetermined potential, the switch provided in the word line 19 is changed to its connected state in order to lower the potential of the control gate 12 up to a predetermined potential (here at, 0 V) (Step T4).

In this manner, by lowering the potential of the control gate 12, a predetermined erasing voltage is applied between the control gate 12 and the P type well 9, and electrons 22 accumulated in the floating gate 14 are discharged through the P type well 9 side, so that the data stored in the storage memory 6 is erased, accordingly (Step T5).

Figure 5:
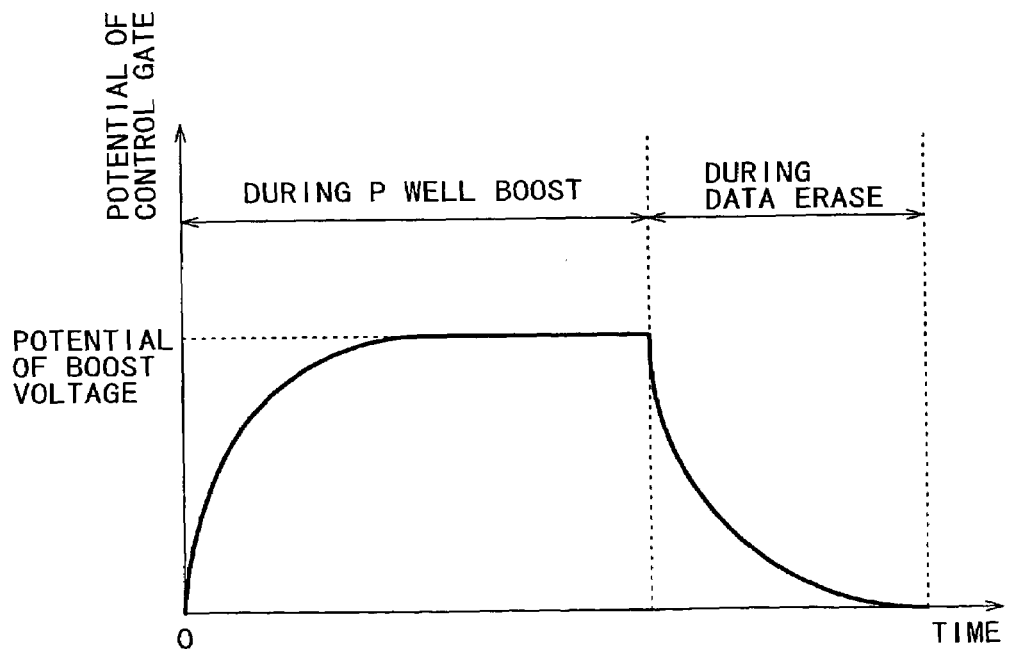
FIG. 5 is an explanatory drawing showing potential increase of a control gate.

Since, at this time, the switch provided in the word line 19 has the predetermined time constant as described above, if this switch is changed to its connected state and a potential of 0 V is applied to the control gate 12, the potential of the control gate 12 decreases gradually as shown in FIG. 5.

Therefore, it is avoidable that the potential of the semiconductor substrate side, which is boosted once, decreases again as the potential of the control gate decreases. This enables to prevent an increase in the power consumption required to boost the potential of the semiconductor substrate at the time of erasing data.

What is claimed is:

1. A data erasing method for erasing stored data by applying an erasing voltage between a semiconductor substrate and a control gate so as to discharge electric charges accumulated in a floating gate, said data erasing method comprising:

boosting a potential of the semiconductor substrate side while placing the control gate into its floating state; and applying an erasing voltage between the semiconductor substrate and the control gate to make the potential of the control gate to a predetermined potential, wherein said potential of the control gate is made to a predetermined potential by lowering in a predetermined period of time such that the boosted potential of the semiconductor substrate side does not decrease.

2. A data erasing method for erasing stored data by applying an erasing voltage between a well provided at a semiconductor substrate and a control gate so as to discharge electric charges accumulated in a floating gate, said data erasing method comprising:

boosting a potential of the semiconductor substrate side while placing the control gate into its floating state; and applying an erasing voltage between the semiconductor substrate and the control gate to make the potential of the control gate to a predetermined potential, wherein said potential of the control gate is made to a predetermined potential by lowering in a predetermined period of time such that the boosted potential of the well side does not decrease.

3. A memory apparatus having a data erasing circuit that erases stored data by applying an erasing voltage between a semiconductor substrate and a control gate so as to discharge electric charges accumulated in a floating gate, wherein;

said data erasing circuit boosts a potential of the semiconductor substrate side while placing the control gate into its floating state; and applies an erasing voltage between the semiconductor substrate and the control gate to make the potential of the control gate to a predetermined potential, wherein said data erasing circuit makes said potential of the control gate to a predetermined potential by lowering in a predetermined period of time such that the boosted potential of the semiconductor substrate side does not decrease.

4. A memory apparatus having a data erasing circuit that erases stored data by applying an erasing voltage between a well provided at a semiconductor substrate and a control gate so as to discharge electric charges accumulated in a floating gate, wherein;

said data erasing circuit boosts a potential of the semiconductor substrate side while placing the control gate into its floating state; and applies an erasing voltage between the semiconductor substrate and the control gate to make the potential of the control gate to a predetermined potential, wherein said data erasing circuit makes said potential of the control gate to a predetermined potential by lowering in a predetermined period of time such that the boosted potential of the well side does not decrease.

* * * * *